(12) United States Patent
Lee et al.

(10) Patent No.: US 6,617,870 B1
(45) Date of Patent: Sep. 9, 2003

(54) SEMICONDUCTOR PROBE STATION

(75) Inventors: Jong-hoon Lee, Yongin (KR); Yu-kwang Shin, Yongin (KR); Young-nam Ko, Yongin (KR); Jae-gyu Kim, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/160,434

(22) Filed: Sep. 24, 1998

(30) Foreign Application Priority Data

Oct. 6, 1997 (KR) .............................. 97-51213

(51) Int. Cl.$^7$ .............................................. G01R 31/26
(52) U.S. Cl. ........................................ 324/765; 324/760
(58) Field of Search ................................ 324/765, 760, 324/158.1; 165/80.3, 80.4; 361/697, 274.2, 676, 687; 62/378, 3.2, 3.3

(56) References Cited

U.S. PATENT DOCUMENTS

| | | | | |
|---|---|---|---|---|
| 3,710,251 A | * | 1/1973 | Hagge et al. | 324/760 |
| 5,084,671 A | * | 1/1992 | Miyata et al. | 324/760 |
| 5,134,436 A | * | 7/1992 | Fujioka | 355/30 |
| 5,325,052 A | * | 6/1994 | Yamashita | 324/760 |
| 5,738,165 A | * | 4/1998 | Imai | 165/80.2 |

\* cited by examiner

*Primary Examiner*—Vinh P. Nguyen
(74) *Attorney, Agent, or Firm*—Marger Johnson & McCollom, PC

(57) ABSTRACT

A semiconductor probe station including a cooling system and method thereof is provided. The probe station is used for Electrical Die Sorting (EDS) of semiconductor device. The probe station cooling system includes an air source for supplying pressurized air, an air supplier having a plurality of nozzles, and an air supply line coupled at a first end to the air source and at a second end to the air supplier for transferring the pressurized air from the air source to the air supplier. The plurality of air openings are provided on one end of each of the plurality of nozzles. The plurality of nozzles are aligned along a first direction. The air supplier includes a first and a second end nozzles having an angled air exit such that the pressurized air is centrally directed.

14 Claims, 4 Drawing Sheets

SEMICONDUCTOR PROBE STATION

BACKGROUND OF THE INVENTION

1. Field of the Invention

The present invention relates to semiconductor probe station, and, more particularly, to a semiconductor probe station including a cooling system and method thereof. The present invention additionally relates to an Electrical Die Sorting process (EDS) using the probe station for testing integrated chips on a semiconductor wafer.

2. Description of the Related Art

Typically, a plurality of integrated chips are formed on a semiconductor wafer through an array of fabrication processes including Oxidation, Chemical Vapor Deposition, Metallization, etc. After fabrication, an EDS method is carried out to examine the electrical state of each chip. Chips that fail are sorted out from chips that pass.

The EDS process is performed on a probe station having a probe chuck being capable of moving along a z-axis driven by driving source. The probe station temperature can be varied from a normal room temperature of about 25 to 35° C. to a high temperature of about 80 to 90° C. A plurality of vacuum holes are provided on a probe station surface for forming a vacuum by absorbing air from outside the probe station. In addition, a probe card is provided a predetermined distance from the probe chuck. The probe card has a plurality of needles that are applied to pads on the chip thereby transferring electrical signals to the circuit of each chip formed on the semiconductor wafer.

The EDS process comprises mounting a wafer having a plurality of chips formed thereon on the probe chuck, raising the temperature of the probe chuck to about 80 to 90° C., and contacting a needle of the probe card with the chip pad on the wafer. The chip is then tested by applying a predetermined electrical current level. The chips that fail are then separated or sorted from the chips that pass the EDS process. The failed chips are sorted into two groups: chips that can be repaired and chips that cannot be repaired.

Based on the EDS data, chips that can be repaired go through a Laser-repair process that utilizes a laser beam to repair the failed chips. The wafer that goes through the Laser-repair process is then placed on the probe chuck. The wafer temperature is allowed to naturally fall to normal room temperature of about 25 to 35° C. After the temperature on the probe chuck cools, the wafer then goes through a Post-repair process for testing the operating state of the repaired chips. The Post-repair process involves contacting the needle of the probe card with the chip pad of the wafer. Thus, the probe chuck in the Pre-laser process is at a high temperature. The probe chuck in the Post-laser process is at a normal room temperature.

The water goes through a Back-grinding process for grinding the back side of the wafer as it goes through the Post-laser process. Thereafter, the wafer goes through an Inking process for identifying the failed chips on the wafer by marking them with ink. The ink on the failed chips is dried by passing through a bake oven. Then, the wafer goes through a Slicing process in which the passing chips are assembled.

The above-described EDS process has an inherent disadvantage. Namely, the Pre-laser process is carried out when the probe chuck is at a high temperature and the Post-laser process is carried out when the probe chuck is at a room temperature. It generally takes between 45 minutes and three hours to bring the chuck temperature down to room temperature. The cooling time varies with the facility used to reduce the temperature of the probe chuck. Accordingly, a need remains for a probe station that improves the efficiency and the productivity of the EDS process.

SUMMARY OF THE INVENTION

It is an object of the present invention to overcome the disadvantages associated with prior art probe stations and cooling systems and methods thereof.

It is another object of the present invention to provide an EDS method that is efficient and productive.

A semiconductor probe station for carrying out an Electronic Die Sorting (EDS) process is provided. The probe station comprises a frame having a top, bottom, back, and front sides and ends; a platen positioned on the top side of the frame; a forcer positioned on the platen including a moving means for moving the forcer along an x-axis and y-axis; a probe chuck attached to the forcer for mounting a wafer, the probe chuck moving along a z-axis; and a cooling system for cooling the probe chuck. The semiconductor probe station further includes a quick loader installed on the top side of the frame for loading the wafer; a manual loader installed on the top side of the frame for manually loading the wafer; a flat zone aligner installed on the top side of the frame for aligning the wafer; and a transfer arm installed on the top side of the frame for transferring the wafer from a carrier to the quick loader. The semiconductor probe station further includes an air supply line coupled to an air source; an supplier coupled to the air supply line, the air supply line transferring pressurized air from an air source to the air supplier and the air supplier transferring the received pressurized air to the probe chuck. The cooling system is mounted on the back side of the frame and is supported by a bracket.

A cooling system for a semiconductor probe station is provided. The cooling system comprises an air source for supplying pressurized air; an air supplier having a plurality of nozzles; an air supply line coupled at a first end to the air source and at a second end to the air supplier for transferring the pressurized air from the air source to the air supplier. A plurality of air openings are provided on one end of each of the plurality of nozzles. The plurality of nozzles is aligned along a first direction. The air supplier includes a first and a second end nozzles having an angled air exit such that the pressurized air is centrally directed. The air supply line includes a solenoid valve for opening and closing the air supply line responsive to an applied voltage. The air supply line includes a filter coupled to the solenoid valve for filtering the pressurized air and a first and a second portion, the first portion having a diameter larger than a diameter of the second portion and the solenoid valve being connected between the first and second portions.

The cooling system includes a first divergence line having a first and a second end, the first end connected to a first end of the air supplier; a second divergence line having a first and a second end, the first end connected at a second end of the air supplier; and a t-shaped line having a first, second, and third ends, the first end of the t-shaped line connected to the second end of the first divergence line, the second end of the t-shaped line connected to the second end of the second divergence line, and the third end of the t-shaped line connected to the air supply line. The air source provides pressurized air having a pressure between 110 and 115 pounds per square inch.

A method for cooling a semiconductor probe station is provided. The probe station comprises a frame having a top, bottom, front, and back sides and ends, a cooling system mounted on the back side of the frame, a vacuum system mounted on the frame, and a probe chuck mounted on the top side of the frame. The method for cooling comprises moving a forcer mounted on the top side of the frame close to the cooling system by a moving means; moving the probe chuck along a z-axis; and cooperatively operating the vacuum and cooling systems to lower a temperature of the probe chuck for a predetermined time. Cooperatively operating the vacuum and cooling systems includes operating the vacuum and cooling systems until the temperature of the probe chuck is between 30° C. and 31° C.

The method further includes applying a post-laser process to a wafer on the probe chuck after the temperature on the probe chuck is lowered and applying a pre-laser process to a wafer on the probe chuck after the temperature on the probe chuck is lowered. The method includes moving the forcer to closer to the cooling system after moving the probe chuck along the z-axis. Cooperatively operating the vacuum and cooling systems includes alternately operating the vacuum system and the cooling system.

An electronic die sorting method for sorting dies in a wafer mounted on a semiconductor probe station is provided. The semiconductor probe station has a cooling system for cooling a probe chuck and a forcer, the probe chuck being positioned on the forcer. The electronic die sorting method comprises detecting a number of wafers loaded in a wafer cassette; moving a forcer mounted on the probe station close to the cooling system; moving the probe chuck down; lowering a temperature of the probe chuck by operating the cooling system and a vacuum; mounting wafers on the probe chuck after detecting the number of wafers loaded on the wafer cassette; aligning the wafers on the probe chuck; and bringing needles on a probe card in contact with pads on the wafers.

The electronic die sorting method further includes profiling the probe chuck after lowering the temperature on the probe chuck and applying an auto probe to pad alignment process after profiling the probe chuck for detecting a distance between the probe chuck and the needles on the probe card in order to align the needles and the pads on the wafer placed.

The electronic die sorting method further includes wafer profiling the wafers mounted on the probe chuck and examining a contact state of the needles and the pads after bringing the needles in contact with the pads on the wafer using Direct Probe Sensor camera.

BRIEF DESCRIPTION OF THE DRAWINGS

The foregoing and other objects, features, and advantages will become more readily apparent from the following description of a preferred embodiment that proceeds with reference to the following drawings.

DETAILED DESCRIPTION OF THE PREFERRED EMBODIMENT

Figure 1:
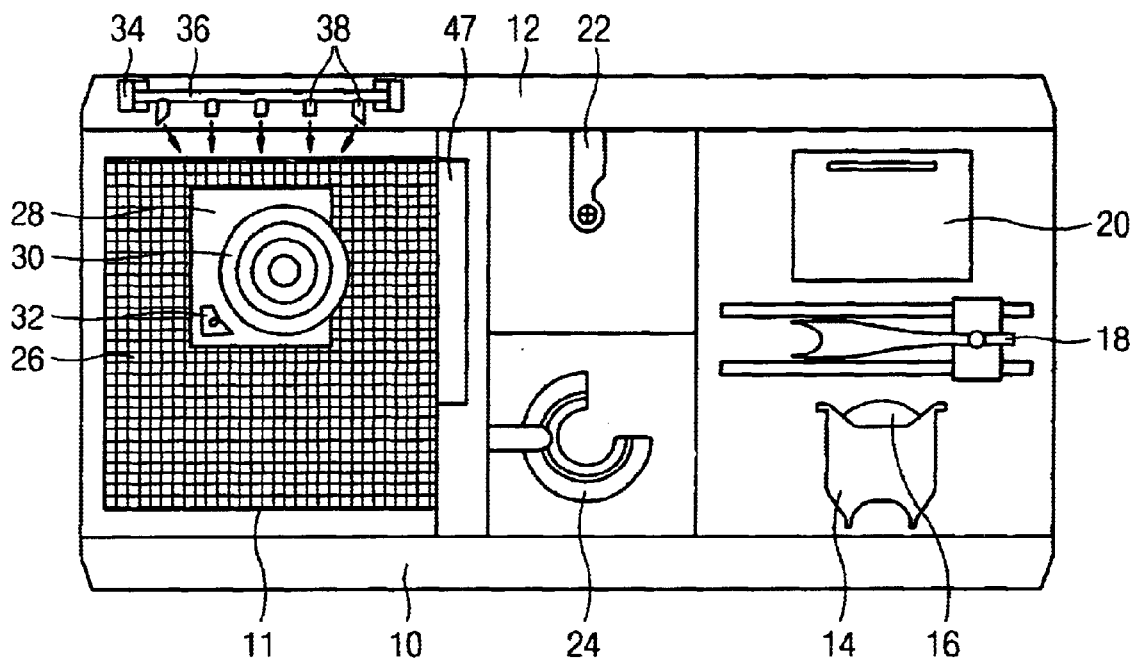
FIG. 1 is a conceptual view of an embodiment of a semiconductor probe station of the present invention.

Referring to FIG. 1, the probe station includes a front side 10 having a screen 11 and a back side 12. A transfer arm 18 is provided for moving a wafer 16 loaded on a carrier 14 to an aligner 20. The aligner 20 aligns the wafer 16. After the wafer 16 is aligned, the wafer 16 is transferred to a quick loader 22. A manual loader 24 is provided on a lower side of the quick loader 22 for manually loading the wager 16, if necessary.

The quick loader 24 transfers the wafer 16 to the probe chuck 30. The probe chuck 30 can vary its temperature from normal room temperature at about 25 to 35° C. to a high temperature at about 80 to 90° C. The probe chuck 30 can move along the z-axis driven by a driving source. The probe chuck 30 includes a plurality of vacuum holes (not shown) provided on its surface. A vacuum apparatus controls the pressure state of the plurality of vacuum holes. The probe chuck 30 is installed on a forcer 28. The forcer 28 moves along an x-axis and a y-axis by a moving means (not shown) that brings the forcer 28 in close proximity to the cooling system 36. The forcer 28 is installed on a station having a platen 26. On one side of the forcer 28, a Direct Probe Sensor (DPS) camera 32 is installed. In addition, a short distance from the probe chuck 30, a probe card (not shown) having a plurality of needles is installed for transferring electrical signals to the integrated circuits or chips on the water. The probe card transfers the electrical signals by contacting the needles to pads on the chips of the wafer.

Figure 2:
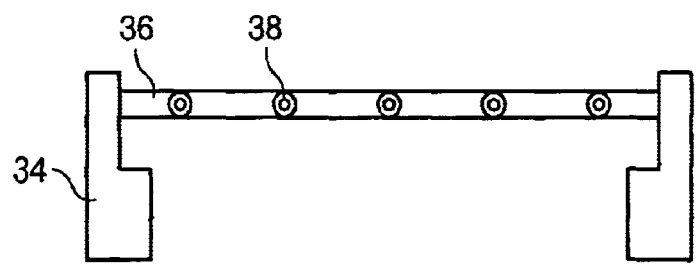
FIG. 2 is a cross-sectional view of a cooling system for the semiconductor probe station shown in FIG. 1.
Figure 3:
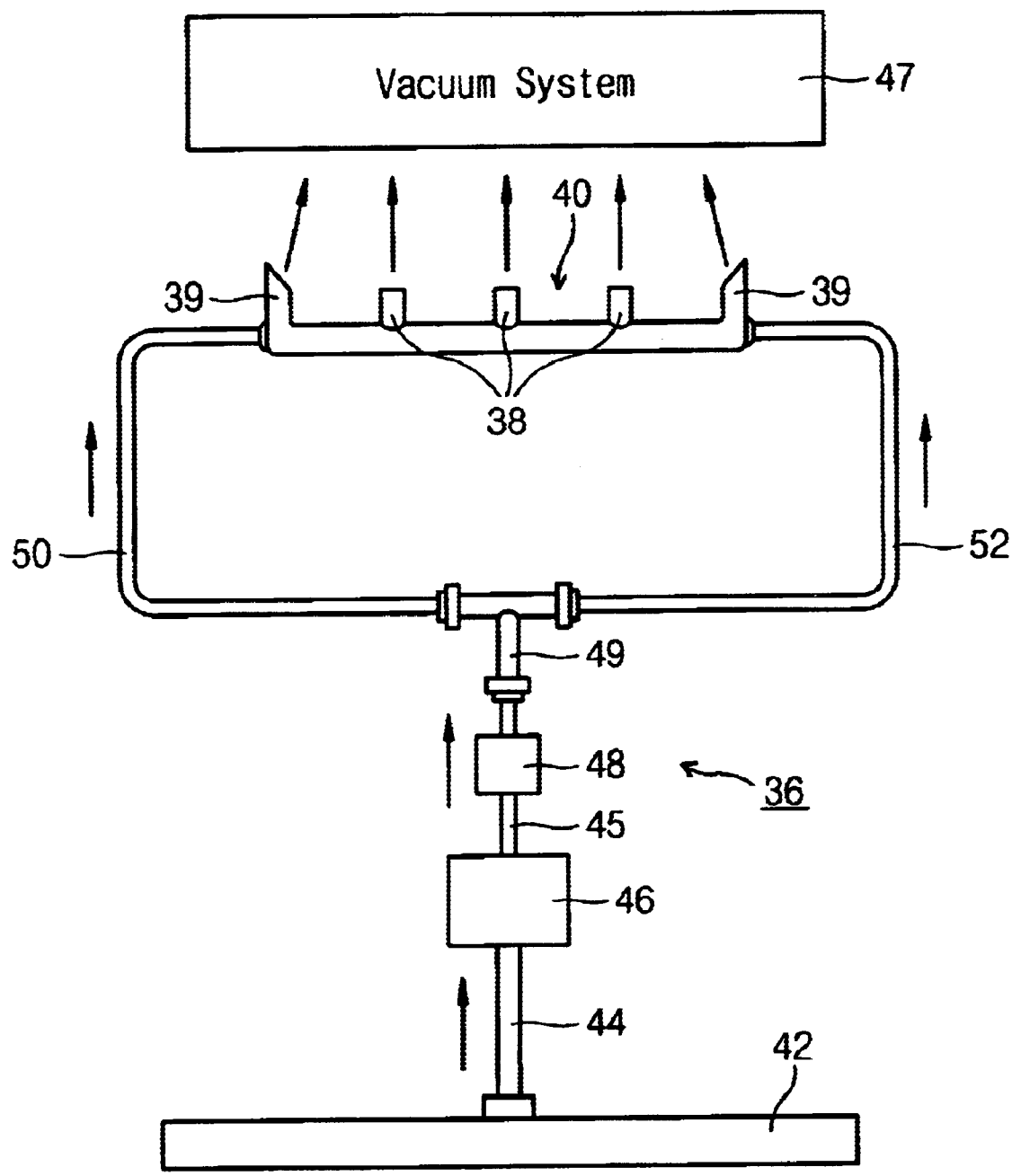
FIG. 3 is a side view of the cooling system for the semiconductor probe station shown in FIGS. 1 and 2.

The cooling system 36, as best shown in FIG. 3, is installed in the back side 12 of the probe station 10. A support bracket 34 as shown in FIG. 2 supports the cooling system 36. Referring to FIG. 3, an air source 42 is installed. The air source 42 supplies very clean air with a pressure of 110 to 115 Psi. The air source 42 is connected to the air supply line 44. The air supply line 44, in turn, is connected to a first divergence line 50 and a second divergence line 52 by a T-shape bracket 49.

On one end of the first divergence line 50 and the second divergence line 52 is installed an air supplier 40 having a plurality of nozzles 38. A plurality of air openings (not shown) is provided on each nozzle 38. The nozzles 38 are aligned along a first direction. At each end of the air supplier 40 are end nozzles 39. Each end nozzle 39 has an angled opening directing air towards the center of the air supplier 40. A solenoid valve 46 that opens or closes responsive according to the applied voltage is installed on the air supply line 44. Air is easily released by forming the diameter of the air supply line 44 at one end of the vale 46 larger than that of the air supply line 45 at the other end of the solenoid valve 46.

The wafer 16, first loaded in the carrier 14, is transferred to the flat zone aligner 20 by operation of the transfer arm 18. The wafer is aligned based on the flat zone thereon in the aligner 20. The wafer 16 is then moved to the quick loader 22 and again moved on the probe chuck 30 at a temperature of 80 to 90° C. Thereafter, the Pre-laser process is performed on the probe chuck 30 and the wafer 16 is moved to a separate stage for repair. At this separate stage, the wafer 16 goes through the Laser-repair process.

The Post-laser process is performed while the wafer 16 is on the probe chuck 30. During the post-laser process, the chuck probe 30 must be at a temperature of 25 to 35° C. To cool the chuck probe 30, a cooling system 36 supplies air from the air supply source 42 with a pressure of approximately 110 to 115 Psi. A certain amount of air from the air supply source 42 passes through the solenoid valve 46 installed on the air supply line 44. The air exiting the solenoid value 46 is then filtered in filter 48 to remove the impurities in the air.

The air passing through the filter 48 is diverted through the first divergence line 50 and the second divergence line 52, and then provided to the air supplier 40. The air supplier 40 sprays air into the high-temperature probe chuck 30 through the plurality of nozzles 38 and end nozzles 39 so that the temperature of the probe chuck 30 is quickly lowered. The cooling efficiency of the probe chuck 30 is improved by the angled opening of the end nozzles 39. The end nozzles 39 direct air toward the probe chuck 30. The end nozzles 39 have the additional effect of removing the impurities existing on the probe chuck and the probe card needles.

Figure 4:
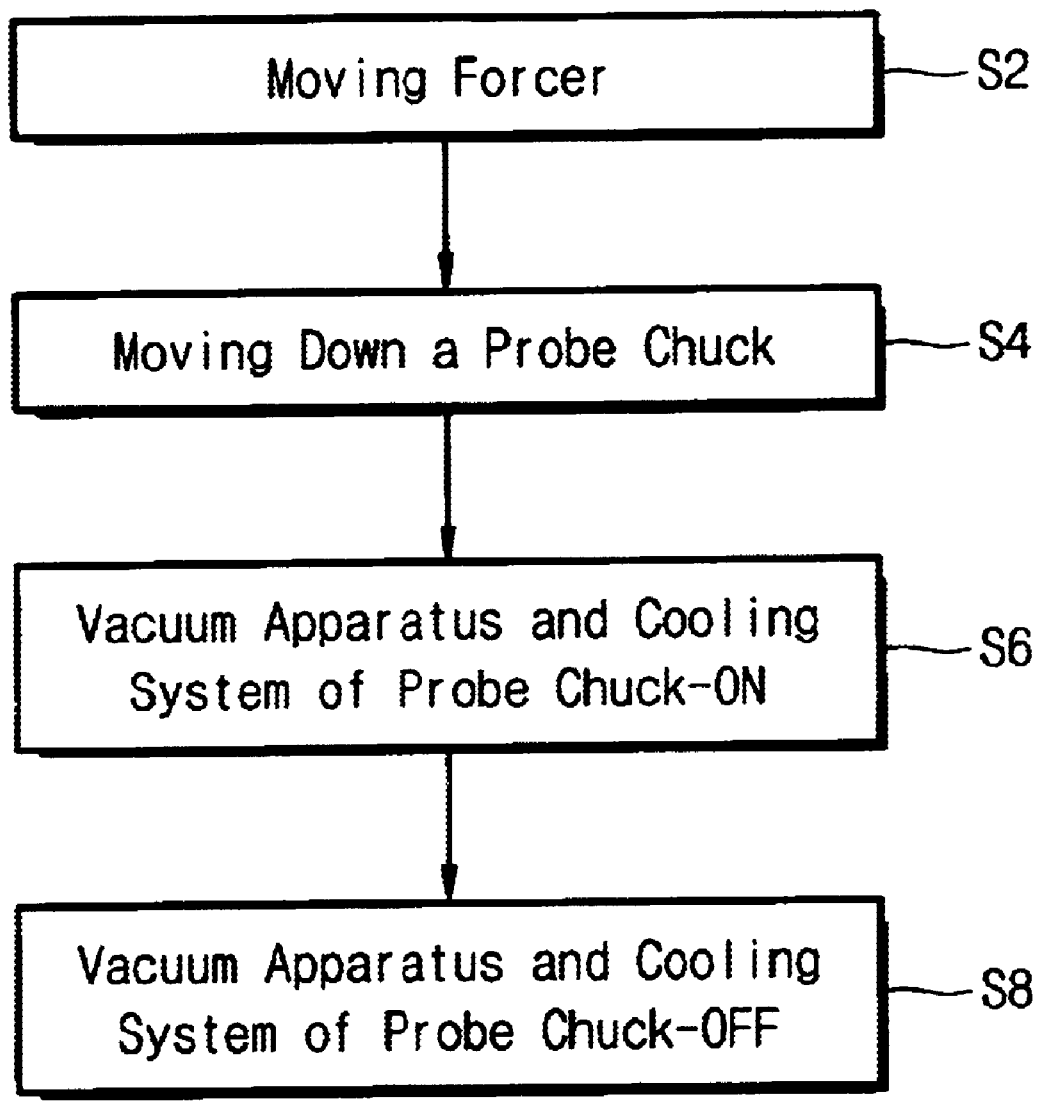
FIG. 4 is a flow chart of a method for cooling a semiconductor probe station according to the present invention.

Referring to FIG. 4, a cooling method for a semiconductor probe station according to the present invention is illustrated. At step 52, a moving means moves a high temperature forcer close to the cooling system 36 installed on the back side 12 of the probe chuck. The probe chuck is moved down along the z-axis at step S4. Doing so prevents the probe station from malfunctioning during the cooling operation of the probe chuck 30 by narrowing the distance between the probe chuck and the needles on the probe. The cooling system begins to cool the chuck probe 30 at step S6. The vacuum system 47 controls the pressure state of the plurality of the vacuum holes provided on the surface of the probe chuck 30. The air from the cooling system is provided to the probe chuck 30 through the vacuum holes on the probe chuck 30 thereby improving the cooling efficiency of the probe chuck 30. When the temperature of the probe chuck falls down to 30 to 31° C., preferably 30.5° C., the cooling system stops. Subsequently, the wafer goes through a Post-laser process or a Pre-laser process. After the probe chuck is moved down along the z-axis, the forcer can be moved close to the cooling system and the operation order of the vacuum system 47 and the cooling system can be exchanged.

Figure 5:
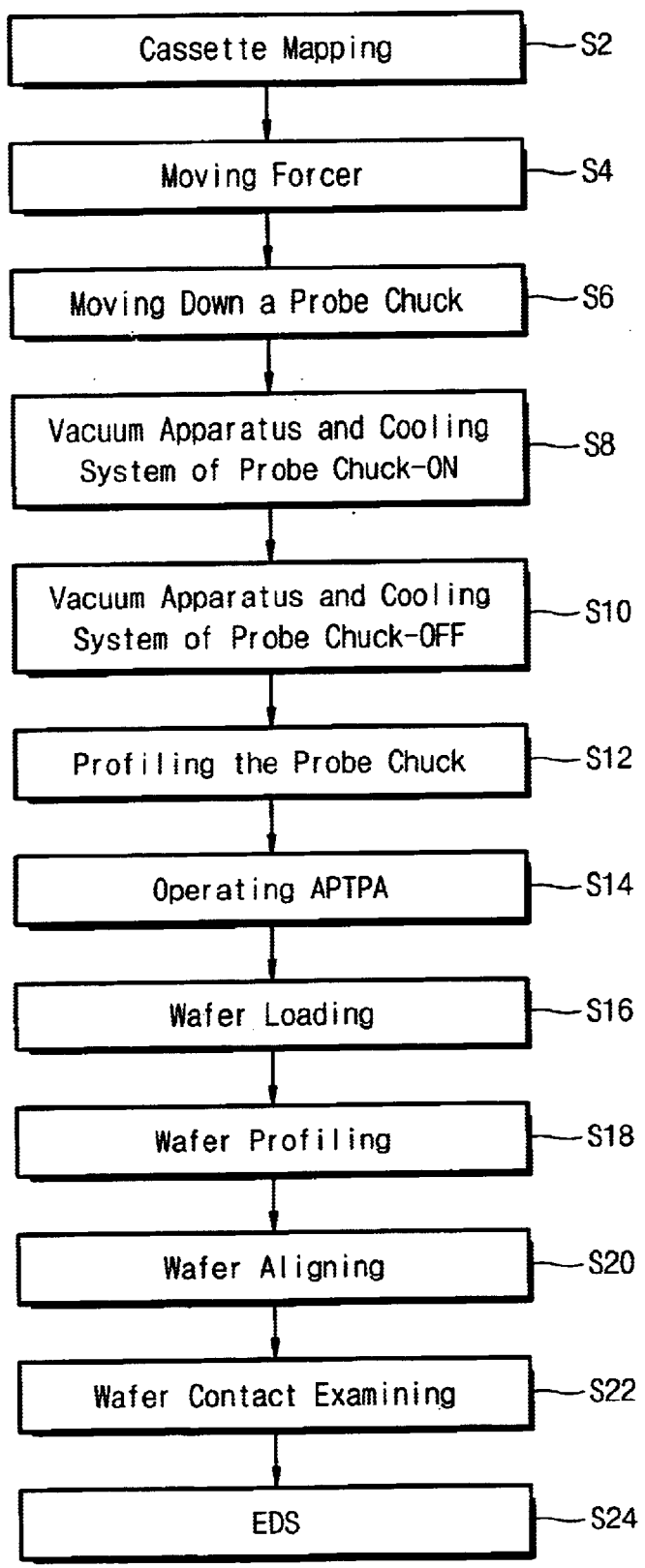
FIG. 5 is a flow chart of an EDS process utilizing the semiconductor probe station shown in FIG. 1.

Referring to FIG. 5, an EDS Electrical die Sorting process using the semiconductor probe station according to the present invention is illustrated. The number of the wafers loaded on a cassette is detected in step S2 by performing a cassette-mapping process. The cassette-mapping process also detects a slot inside the cassette having no wafer. At step S4, the high temperature forcer is moved close to the cooling system 36 installed on the back side 12 of the probe chuck 30.

At step S6, the probe chuck 30 on the forcer is moved down along the z-axis. Moving the probe chuck 30 prevents the probe station from malfunctioning during the cooling process. In step S8, the cooling system as shown in FIG. 3 is operated. The vacuum system 47 controls the pressure state of a plurality of vacuum holes formed on the surface of the probe chuck 30. With the operation of the vacuum system 47, the air from the cooling system comes out through the vacuum holes on the probe chuck so as to improve the cooling efficiency of the probe chuck 30.

In step S10, when the temperature of the probe chuck is down to between 30 to 31° C., preferably 30.5° C., the operation of the cooling system 36, and the vacuum system 47 thereof stops. At step S12, the profiling process for measuring the even state of the probe chuck is carried out. Then, an Auto Probe To Pad Alignment (APTA) process is carried out (step S14). That is, the distance between the probe chuck and the needles on the probe card is measured such that the needles of the probe card and the pads of the chips on the wafer are aligned.

In step S16, the wafers that went through the cassette-mapping process in step S2 is placed on the probe chuck 30. In step S18, the wafer is profiled through a wafer profiling process so that the even state of the wafer placed on the probe chuck is achieved. The wafer is aligned such that the pad of the chip on the wafer placed on the probe chuck and the needles of the probe card are aligned (step S20). Thereafter, the needles are contacted with the pad. In step S22, the wafer is examined by a DPS camera located on one side of the probe chuck 30 to determine whether the pad of the chip and the needles of the probe card are in normal contact. Finally, in step S24, the chips on the wafer are tested using the EDS process.

According to the present invention, the temperature of the probe chuck on the probe station is easily brought down using the cooling system so that the time necessary for the EDS process is shortened. Further, the contaminants existing on the probe chuck and the probe card are efficiently removed by the cooling system of the present invention.

Having illustrated and described the principles of my invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A method for cooling a semiconductor probe station, the probe station comprising a frame having a top, bottom, front, and back sides, a cooling system mounted on the back side of the frame, a vacuum system mounted on the frame, a probe chuck mounted on the top side of the frame, and a forcer mounted on the top side of the frame, the probe chuck being mechanically coupled to a driving source capable of moving the probe chuck in a z-axis and being mechanically coupled to the forcer, the forcer being capable of moving the probe chuck in an x- and y-axis, the method comprising:

moving the forcer close to the cooling system;

moving the probe chuck along a z-axis;

directing air from the cooling system to the probe chuck; and cooperatively operating the vacuum and cooling systems drawing the directed air through the probe chuck to thereby cool the probe chuck for a predetermined time.

2. The method of claim 1 wherein cooperatively operating the vacuum and cooling systems includes operating the vacuum and cooling systems until the temperature of the probe chuck is between 30° C. and 31° C.

3. The method of claim 1 including applying a post-laser process to a wafer on the probe chuck after the temperature on the probe chuck is lowered.

4. The method of claim 1 including applying a pre-laser process to a wafer on the probe chuck after the temperature on the probe chuck is lowered.

5. The method of claim 1 including moving the forcer to closer to the cooling system after moving the probe chuck along the z-axis.

6. The method of claim 1 wherein cooperatively operating the vacuum and cooling systems includes alternately operating the vacuum system and the cooling system.

7. The method of claim 1 wherein the cooling system includes a pressurized air source, an air supplier having a plurality of nozzles, and an air supply line coupled at a first end to the air source and at a second end to the air supplier, and wherein directing air from the cooling system to the probe chuck includes transferring pressurized air from the pressurized air source to the air supplier through the air supply line.

8. The method of claim 7 including directing air along a first direction with an end nozzle, directing air along a second direction with another end nozzle, and directing air along a third direction with the remaining nozzles.

9. The method of claim 7 including angularly directing air from the cooling system to the probe chuck through end nozzles positioned at ends of the air supplier, the end nozzles having angled air openings that centrally direct the pressurized air.

10. The method of claim 7 including opening and closing the air supply line with a solenoid valve responsive to an applied voltage.

11. The method of claim 7 including filtering the pressurized air with a filter coupled to the solenoid valve.

12. The method of claim 7 including providing the air supply line with a first and a second portion, the first portion having a diameter larger than a diameter of the second portion and connecting the solenoid valve between the first and second portions.

13. The method of claim 7 including:

connecting a first end of a divergence line to a first end of the air supplier;

connecting a first end of a second divergence line to a second end of the air supplier; and connecting a t-shaped line between the first and second divergence lines and the air supply line.

14. The method of claim 13 including providing pressurized air having a pressure between 110 and 115 pounds per square inch.

* * * * *

UNITED STATES PATENT AND TRADEMARK OFFICE
CERTIFICATE OF CORRECTION

PATENT NO. : 6,617,870 B1
DATED : September 9, 2003
INVENTOR(S) : Lee et al.

It is certified that error appears in the above-identified patent and that said Letters Patent is hereby corrected as shown below:

<u>Column 5,</u>
Line 64, "EDS Electrical die Sorting Process" should read -- EDS process --.

Signed and Sealed this

Ninth Day of March, 2004

JON W. DUDAS
*Acting Director of the United States Patent and Trademark Office*